(12) United States Patent
Oh et al.

(10) Patent No.: US 11,765,812 B2
(45) Date of Patent: Sep. 19, 2023

(54) ELECTRONIC DEVICE COMPRISING PRINTED CIRCUIT BOARD WITH SLITS

(71) Applicant: Samsung Electronics Co., Ltd., Gyeonggi-do (KR)

(72) Inventors: Namseok Oh, Gyeonggi-do (KR); Minkyu Shim, Gyeonggi-do (KR); Hyunjae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 139 days.

(21) Appl. No.: 17/421,043

(22) PCT Filed: Jan. 13, 2020

(86) PCT No.: PCT/KR2020/000562
§ 371 (c)(1),
(2) Date: Jul. 7, 2021

(87) PCT Pub. No.: WO2020/149588
PCT Pub. Date: Jul. 23, 2020

(65) Prior Publication Data
US 2022/0061151 A1  Feb. 24, 2022

(30) Foreign Application Priority Data
Jan. 14, 2019 (KR) .................. 10-2019-0004562

(51) Int. Cl.
*H05K 1/02* (2006.01)
*H05K 1/18* (2006.01)

(52) U.S. Cl.
CPC .......... *H05K 1/0218* (2013.01); *H05K 1/0228* (2013.01); *H05K 1/185* (2013.01); *H05K 2201/09063* (2013.01); *H05K 2201/10121* (2013.01)

(58) Field of Classification Search
CPC .... H05K 1/0218; H05K 1/0228; H05K 1/185; H05K 2201/09063; H05K 2201/10121
See application file for complete search history.

(56) References Cited

U.S. PATENT DOCUMENTS

| 8,461,943 B2 | 6/2013 | Kato |
| 9,713,251 B2 | 7/2017 | Kato |
| 9,883,584 B2 | 1/2018 | Toyoshima |
| 9,955,567 B2 | 4/2018 | Choi et al. |
| 2005/0224912 A1 | 10/2005 | Rogers et al. |
| 2012/0257359 A1* | 10/2012 | Fu ...................... H05K 1/0227 361/748 |

(Continued)

FOREIGN PATENT DOCUMENTS

| JP | 2010-50298 A | 3/2010 |
| JP | 2016-76540 A | 5/2016 |

(Continued)

*Primary Examiner* — Hoa C Nguyen
(74) *Attorney, Agent, or Firm* — Cha & Reiter, LLC

(57) ABSTRACT

An electronic device according to various embodiments of the disclosure may include a printed circuit board constructed with a layered structure of a plurality of boards, and may include, among the plurality of boards, a circuit board constructed around a first region to which an acoustic component is disposed, and having at least one slit constructed to block a low-frequency band noise.

13 Claims, 15 Drawing Sheets

(56) References Cited

U.S. PATENT DOCUMENTS

| | | | |
|---|---|---|---|
| 2013/0207740 A1* | 8/2013 | Kato | H01P 5/028 |
| | | | 333/33 |
| 2016/0133532 A1 | 5/2016 | Nishino et al. | |
| 2016/0285167 A1* | 9/2016 | Tsai | H01Q 13/106 |
| 2018/0177040 A1* | 6/2018 | Yoshida | H05K 9/0039 |
| 2018/0269561 A1* | 9/2018 | Kim | H01Q 1/48 |
| 2019/0123437 A1* | 4/2019 | Jeanne | H05K 1/0227 |
| 2020/0092984 A1 | 3/2020 | Odagiri | |

FOREIGN PATENT DOCUMENTS

| | | |
|---|---|---|
| JP | 2018-101682 A | 6/2018 |
| WO | 2018/128120 A1 | 7/2018 |

* cited by examiner

ELECTRONIC DEVICE COMPRISING PRINTED CIRCUIT BOARD WITH SLITS

CROSS REFERENCE TO RELATED APPLICATIONS

This application is a National Phase Entry of PCT International Application No. PCT/KR2020/000562, which was filed on Jan. 13, 2020, and claims a priority to Korean Patent Application No. 10-2019-0004562, which was filed on Jan. 14, 2019, the contents of which are incorporated herein by reference.

TECHNICAL FIELD

The disclosure relates to a structure of a printed circuit board for blocking a low-frequency noise produced at a multi-layered printed circuit board used in an electronic device.

BACKGROUND ART

In order to block a low-frequency band noise produced at a power source and a ground, a structure of a printed circuit board mounted on an electronic device has been designed by using a plurality of high-capacity capacitors, or by reducing a noise transfer value, or by physically completely separating a region having many (Integrated Circuits) ICs or components using a low-frequency band from a region having many ICs using a high-frequency band.

DISCLOSURE OF INVENTION

Technical Problem

However, when the plurality of capacitors are used to block the low-frequency band noise produced at the power source and the ground, the plurality of high-capacity capacitors are necessarily disposed to a Power Delivery Network (DPN) constructed by the power source and the ground. In this case, an available mounting space is decreased due to a physical size of the high-capacity capacitor, which results in an increase in material cost. In addition, it was impossible to block a power/ground noise in a frequency range from DC to kHz with a chip capacitor array to be mounted on the printed circuit board.

Accordingly, the low-frequency band of the printed circuit board is spatially completely separated from the high-frequency band thereof. However, in the latest electronic device which is thin and light, since a mounting region is very narrow, a battery power source and other ICs corresponding to the low-frequency band and signal lines of an RF signal and high-speed transmission signal (USB3.0, UFS, MIPI, etc.) corresponding to the high frequency band are inevitably disposed together, complete separation of regions is not possible. In addition, when the ground of the printed circuit board is partially separated, there is a disadvantage in that a high-speed signal cannot be wired in the vicinity thereof.

The electronic device according to various embodiments of the disclosure may have a slit constructed to separate a ground at a low-frequency band from a noise producing component or a noise-sensitive component, thereby providing a printed circuit board including a ground bridge structure and variable-width structure capable of preventing a possible deterioration in signal quality of a high-frequency band.

Solution to Problem

An electronic device according to various embodiments of the disclosure may include a printed circuit board constructed with a layered structure of a plurality of boards, and may include, among the plurality of boards, a circuit board constructed around a first region to which an acoustic component is disposed, and having at least one slit constructed to block a low-frequency band noise.

An electronic device according to various embodiments of the disclosure may include a printed circuit board constructed with a layered structure of a plurality of boards, and may include, among the plurality of layered boards, a first circuit board including a ground plane constructed on at least one face, a slit constructed in at least some regions of the ground plane, and at least one ground bridge structure traversing the slit, and a second circuit board including at least one high-speed signal line disposed such that at least one portion overlaps over or under the ground bridge structure.

An electronic device according to various embodiments of the disclosure may include a printed circuit board constructed with a layered structure of a plurality of boards, and may include, among the plurality of layered boards, a first circuit board including a ground plane constructed on at least one face and a slit constructed in at least some regions of the ground plane, and a second circuit board disposed over or under the first circuit board and including at least one high-speed signal line. The first circuit board may include at least one ground bridge structure traversing the slit to provide a return current path of each of the high-speed signal lines.

Advantageous Effects of Invention

A printed circuit board according to an embodiment of the disclosure is effective in blocking a low-frequency band noise when a slit is applied around a receiver or speaker of an electronic device, A printed circuit board according to an embodiment of the disclosure is effective in reducing a low-frequency band noise and is capable of preventing a deterioration in signal quality of a high-frequency band, when a slit and a bridge structure are applied between a receiver or speaker and camera module of an electronic device.

BEST MODE FOR CARRYING OUT THE INVENTION

Figure 1:
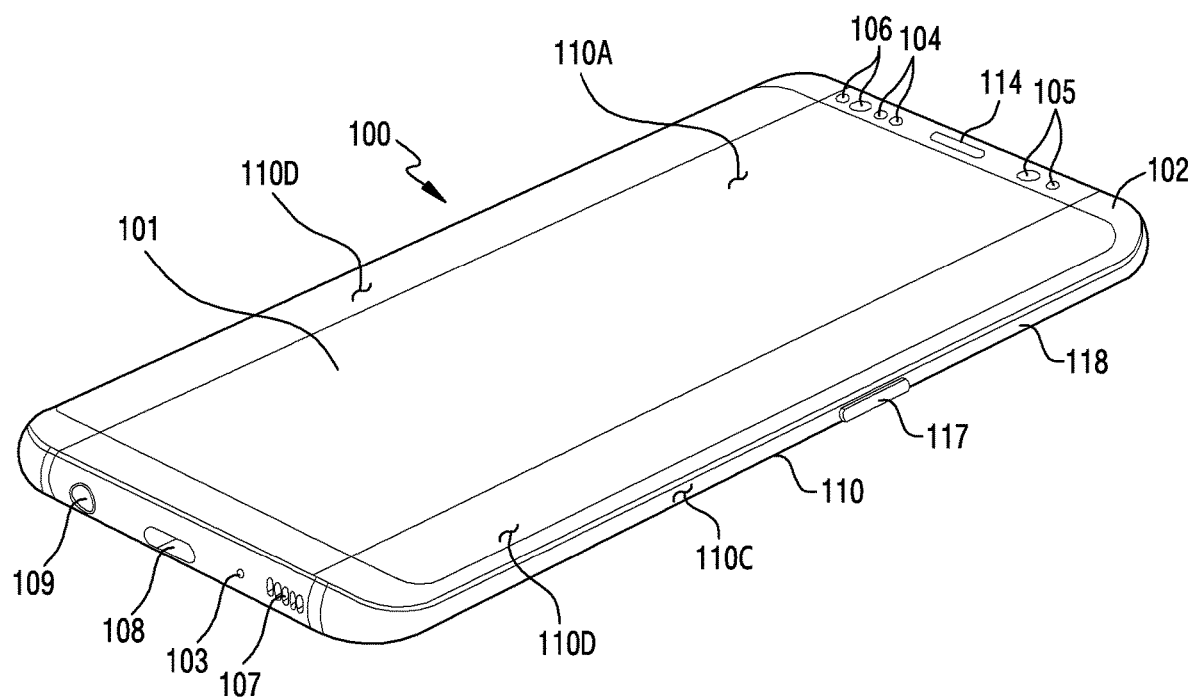
FIG. 1 is a front perspective view of a mobile electronic device according to an embodiment.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smartphone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 2:
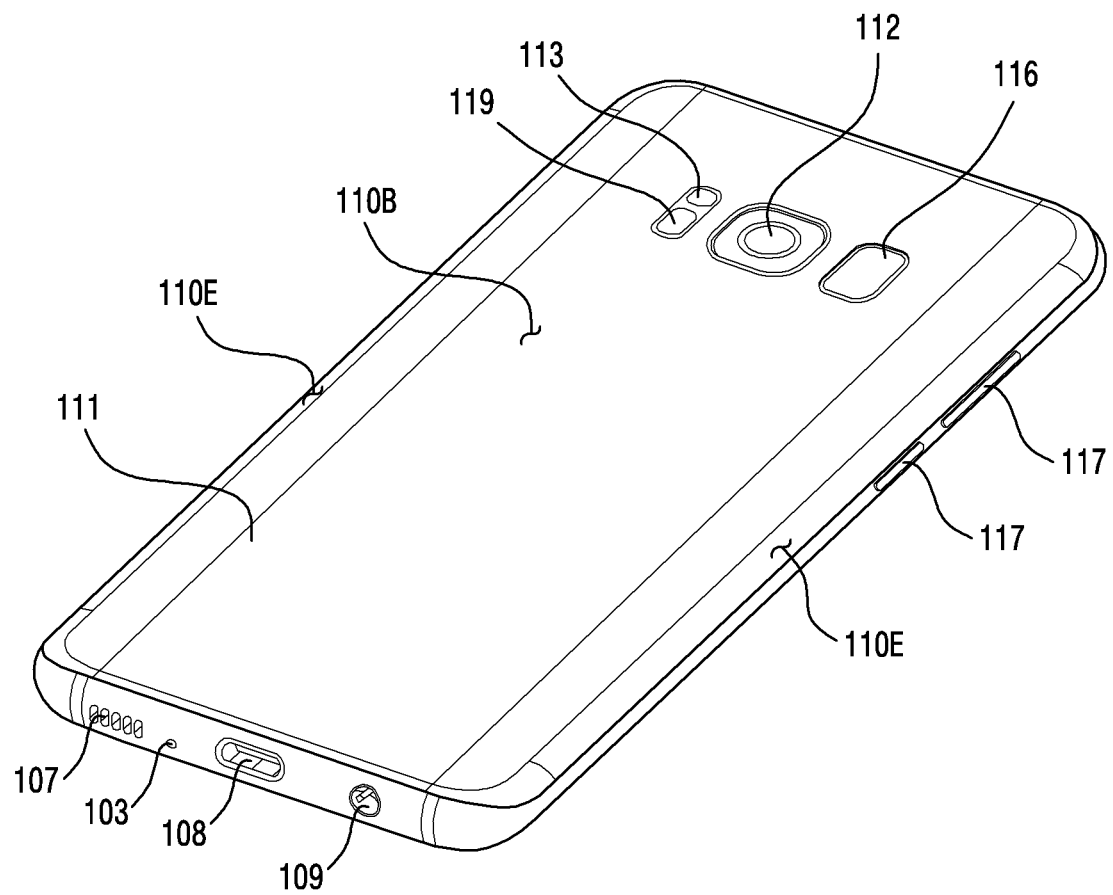
FIG. 2 is a rear perspective view of the electronic device of FIG. 1.

FIG. 1 is a front perspective view of a mobile electronic device according to an embodiment. FIG. 2 is a rear perspective view of the electronic device of FIG. 1.

Referring to FIG. 1 and FIG. 2, an electronic device 100 according to an embodiment may include a housing 110 including a first face (or a front face) 110A, a second face (or a rear face) 110B, and a lateral face 110C surrounding a space between the first face 100A and the second face 110B. In another embodiment (not shown), the housing may refer to a construction which constitutes part of the first face 110A, second face 110B, and third face 110C of FIG. 1. According to an embodiment, the first face 110A may be constructed of a front plate 102 (e.g., a polymer plate or a glass plate having various coating layers) which is at least partially transparent in practice. The second face 110B may be constructed of a rear plate 111 which is opaque in practice. For example, the rear plate 111 may be constructed of coated or colored glass, ceramic, polymer, metallic materials (e.g. aluminum, stainless steel (STS), or magnesium) or a combination of at least two of the these materials. The lateral face 110C may be constructed with a lateral bezel structure (or a lateral member) 118 bonded to the front plate 102 and the rear plate 111 and including metal and/or polymer. In some embodiments, the rear plate 111 and the lateral bezel structure 118 may be constructed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include only one of the first regions 110D (or the second regions 110E). In another embodiment, some of the first regions 110D or the second regions 110E may not be included. In the above embodiments, in a lateral view of the electronic device 100, the lateral bezel structure 118 may have a first thickness (or width) at a lateral face in which the first regions 110D or the second regions 110E are not included, and may have a second thickness thinner than the first thickness at a lateral face in which the first regions 110E or the second regions 110E are included.

According to an embodiment, the electronic device 100 may include at least one or more of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least part of the display 101 may be exposed through the first face 110A and the front plate 102 constructing the first regions 110E of the lateral face 110C. In some embodiments, a corner of the display 101 may be constructed to be substantially the same as an outer boundary adjacent to the front plate 102. In another embodiment (not shown), in order to expand an area in which the display 101 is exposed, the display 110 and the front plate 102 may be constructed to have substantially the same interval between outer boundaries thereof.

In another embodiment (not shown), part of a screen display region of the display 101 may have a recess or opening, and may include at least one or more of the audio module 114, sensor module 104, camera module 105, and light emitting element 106 which are aligned with the recess or the opening. In another embodiment (not shown), at least one of the audio module 114, the sensor module 104, the camera module 105, the fingerprint sensor 116, and the light emitting element 106 may be included in a rear face of the screen display region of the display 101. In another embodiment (not shown), the display 101 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 104 and 119 and/or at least part of the key input device 117 may be disposed to the first regions 110D and/or the second regions 110E.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker (e.g., a piezo speaker) may be included without the speaker holes 107 and 114.

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119 (e.g., a Heart Rate Monitoring (HRM) sensor) disposed to the second face 110B of the housing 110 and/or the fourth sensor module 116 (e.g., a fingerprint sensor). The fingerprint sensor may be disposed not only to the first face 110A (e.g., the display 101) but also the second face 110B of the housing 110. The electronic device 100 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 105, 112, and 113 may include the first camera device 105 disposed to the first face 110A of the electronic device 100, the second camera device 112 disposed to the second face 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one face of the electronic device 100.

The key input device 117 may be disposed to the lateral face 110C of the housing 110. In another embodiment, the electronic device 100 may not include the entirety or part of the aforementioned key input device 117. The key input device 117, which is not included, may be implemented on a display 101 in a different form such as a soft key or the like. In some embodiments, the key input device may include the sensor module 116 disposed to the second face 110B of the housing 110.

The light emitting element 106 may be disposed, for example, to the first face 110A of the housing 110. The light emitting element 106 may provide, for example, state information of the electronic device 100 in an optical form. In another embodiment, the light emitting element 106 may provide, for example, a light source interworking with an operation of the camera module 105. The light emitting element 106 may include, for example, an LED, an IR LED, and a xenon lamp.

The connector holes 108 and 109 may include the first connector hole 108 capable of housing a connector (e.g., a USB connector) for transmitting/receiving power and/or data of an external electronic device and/or the second connector hole (e.g., earphone jack) 109 capable of housing a connector for transmitting/receiving an audio signal with respect to the external electronic device.

Figure 3:
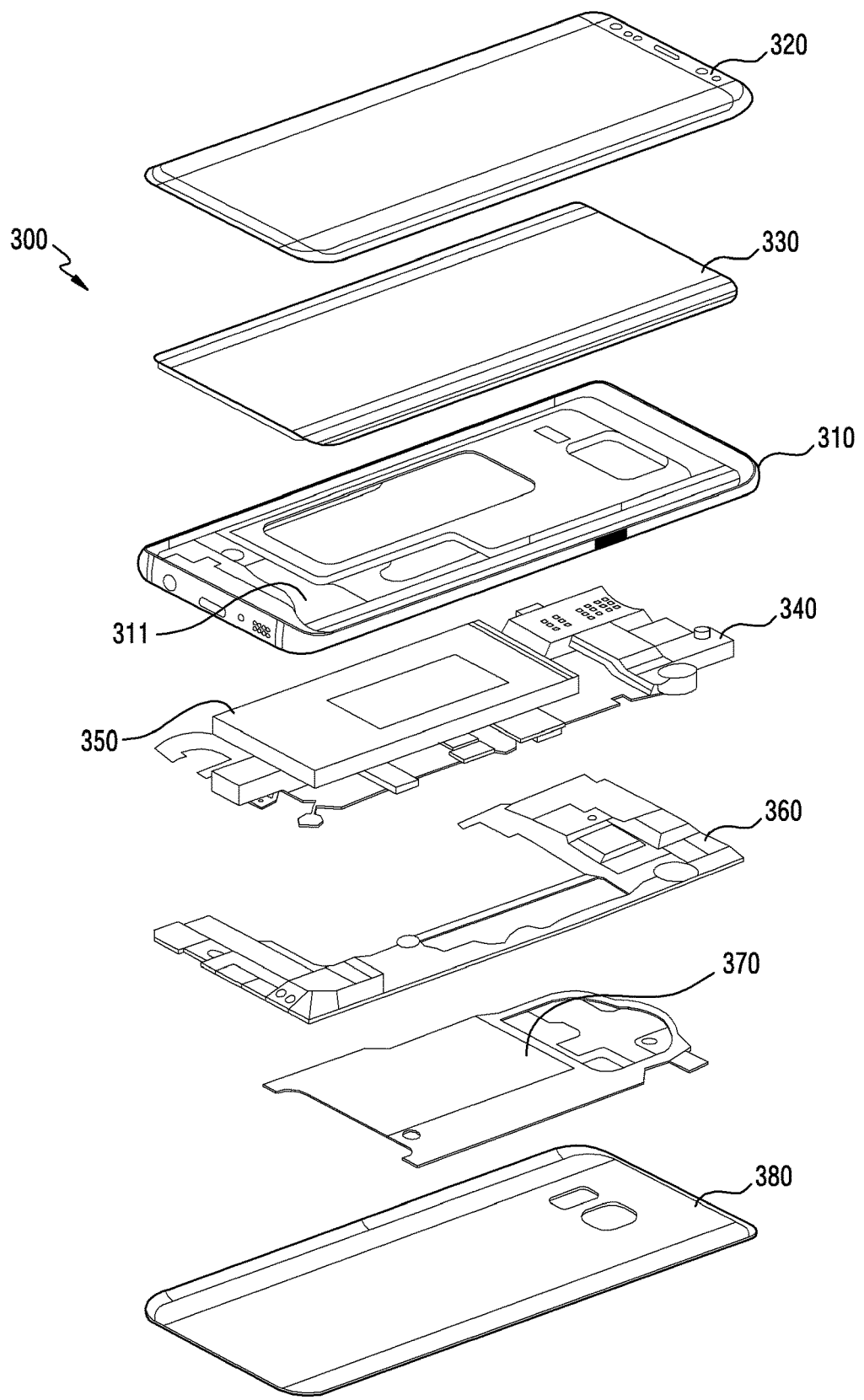
FIG. 3 is an exploded perspective view illustrating an internal structure of the electronic device of FIG. 1.

FIG. 3 is an exploded perspective view illustrating an internal structure of the electronic device of FIG. 1.

Referring to FIG. 3, an electronic device 300 may include a lateral bezel construction 310, a first support member 311 (e.g., a bracket), a front plate 320, a display 330, a printed circuit board 340, a battery 350, a second support member 360 (e.g., a rear case), an antenna 370, and a rear plate 380. In some embodiments, the electronic device 300 may omit at least one (e.g., the first support member 311 or the second support member 360) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the lateral bezel construction 310 by being disposed inside the electronic device 300, or may be constructed integrally with respect to the lateral bezel construction 310. The first support member 311 may be constructed of, for example, a metal material and/or non-metal material (e.g., polymer). The display 330 may be bonded to one face of the first support member 311, and the printed circuit board 340 may be bonded to the other face thereof. A processor, a memory, and/or an interface may be mounted on the printed circuit board 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 300 and the external electronic device, and may include a USB connector, an SD card/MMC connector, or an audio connector.

As a device for supplying power to at least one component of the electronic device 300, the battery 350 may include, for example, a non-rechargeable primary cell, a rechargeable secondary cell, or a fuel cell. At least part of the battery 350 may be disposed on the same plane substantially with respect to, for example, the printed circuit board 340. The battery 350 may be disposed integrally inside the electronic device 300, or may be detachably disposed with respect to the electronic device 300.

The antenna 370 may be disposed between the rear plate 380 and the battery 350. The antenna 370 may include, for example, a Near Field Communication (NEC) antenna, a wireless charging antenna, and/or a Magnetic Secure Transmission (MST) antenna. The antenna 370 may perform NEC, for example, with the external electronic device, or may wirelessly transmit/receive power required for charging. In another embodiment, an antenna construction may be constructed by at least part of the lateral bezel construction 310 and/or the first support member 311 or a combination thereof.

Figure 4A:
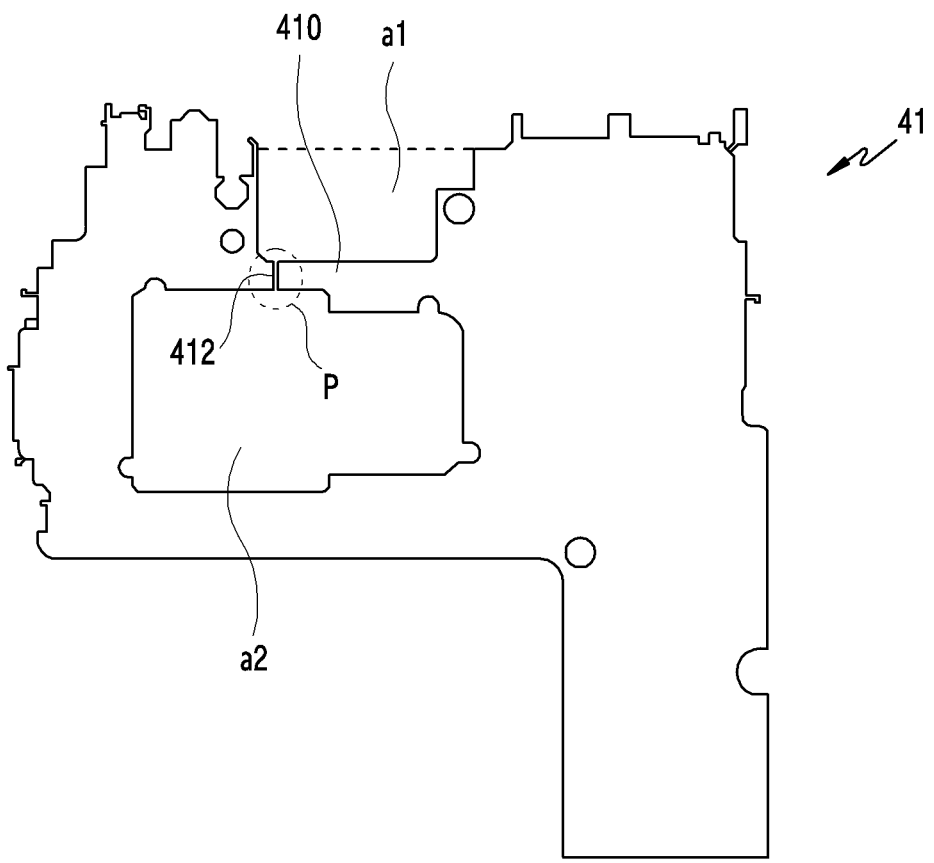
FIG. 4A is a plan view specifically illustrating a printed circuit board according to various embodiments of the disclosure.

FIG. 4A is a plan view specifically illustrating a printed circuit board according to various embodiments of the disclosure.

Referring to FIG. 4A, at least one printed circuit board 41 (e.g., the printed circuit board 340 of FIG. 3) mounted on an electronic device (e.g., the electronic device 100 of FIG. 1 and FIG. 2 or the electronic device 300 of FIG. 3) according to an embodiment may be constructed with a layered structure of a plurality of boards. According to an embodiment, the printed circuit board 41 may have a slit 412 constructed to block a noise of a low-frequency band. The slit 412 may be constructed in a shape of an opening traversing between a first region a1 and a second region a2. According to an embodiment, the slit 412 may be constructed on a ground plane 410 constructed in at least some regions of a first face of the printed circuit board 41. The ground plane 410 may be a conductive layer.

According to an embodiment, the slit 412 may be constructed in a shape of a shortest distance between the first region a1 and the second region a2, and may be constructed, for example, in a linear shape.

Figure 4B:
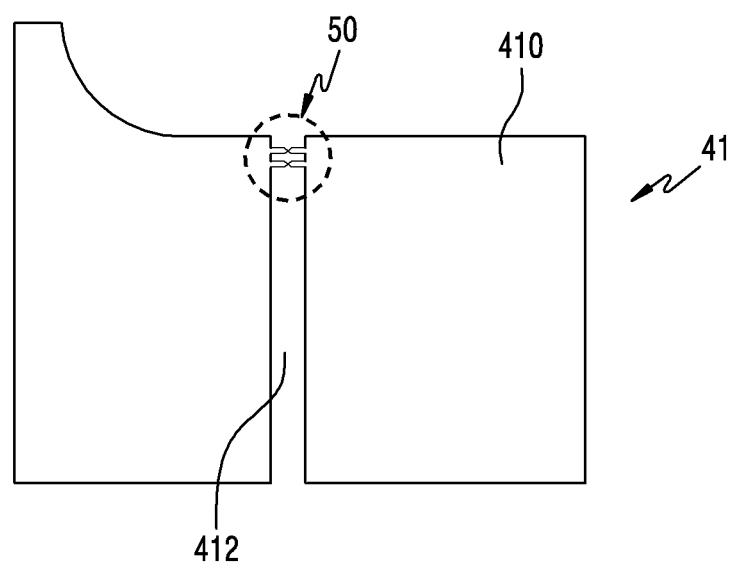
FIG. 4B is an enlarged view of a portion P of FIG. 4A.
Figure 4C:
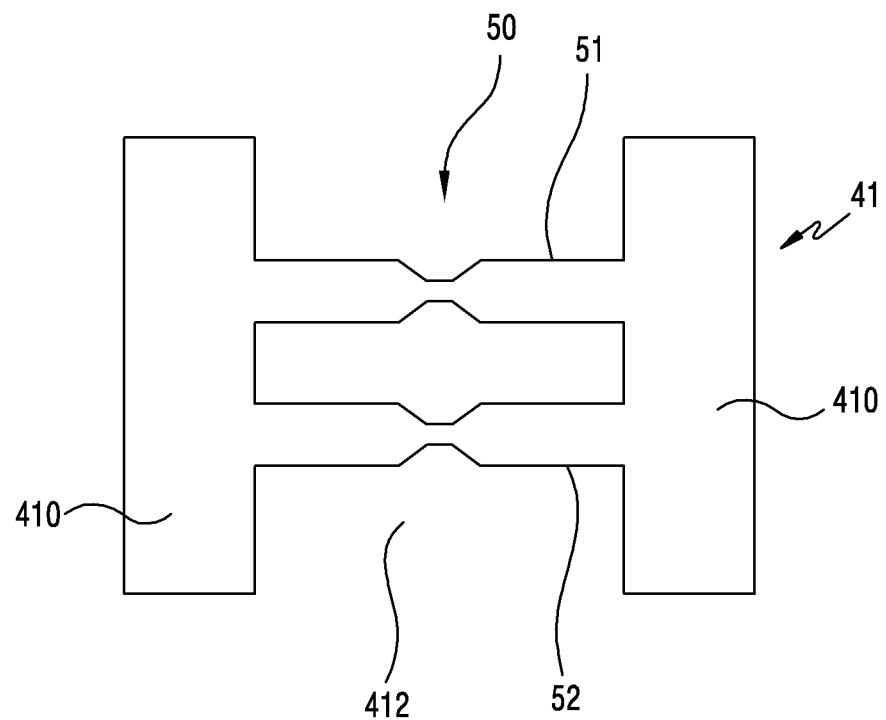
FIG. 4C is an enlarged view of a variable width structure of FIG. 4B.

FIG. 4B is an enlarged view of a portion P of FIG. 4A. FIG. 4C is an enlarged view of a variable-width structure of FIG. 4B.

Referring to FIG. 4B and FIG. 4C, a printed circuit board 41 according to an embodiment may include a ground bridge structure 50 traversing a slit 412 constructed in at least some regions of a ground plane 410. The ground bridge structure 50 may include one or more ground bridges 51 and 52. For example, each of the ground bridges 51 and 52 may be constructed to provide a return current path of a high-speed signal on another printed circuit board 41 disposed over or under the printed circuit board 41. According to another embodiment, the ground bridges 51 and 52 may have a conductive structure for connecting one side and the other side of the ground plane 410 split by the slit 412 with a shortest distance. According to an embodiment, the slit 412 may be split into at least two slits 412 by the respective ground bridges 51 and 52.

Figure 5:
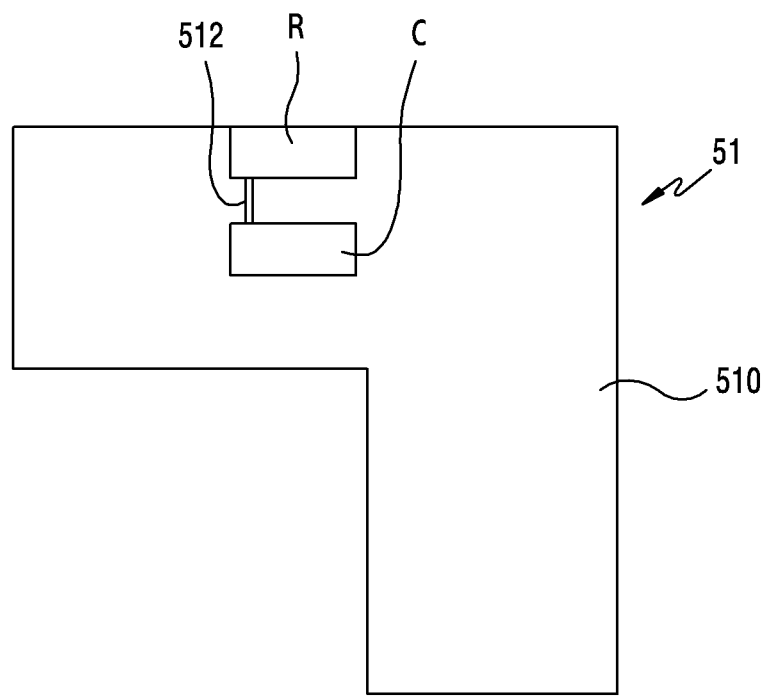
FIG. 5 is a plan view briefly illustrating a printed circuit board according to various embodiments of the disclosure.

FIG. 5 is a plan view briefly illustrating a printed circuit board according to various embodiments of the disclosure.

Referring to FIG. 5, a printed circuit board 51 according to an embodiment may include a slit 512 traversing between a first component R disposed to a first region (e.g., the first region a1 of FIG. 4A) and a second component C disposed to a second region (e.g., the second region a2 of FIG. 4A). For example, the first component R may be an acoustic component, and the second component C may be an optical component. The first component R may include a receiver (e.g., the audio module 114 of FIG. 1) or a speaker, and the second component C may include a camera module (e.g., the camera module 112 of FIG. 2). The receiver or the speaker may be disposed to an upper portion of a front plate of the electronic device, and the camera module may be a rear camera module. The slit 512 may be constructed to traverse with a shortest distance between the first and second components.

According to an embodiment, the slit 512 may be constructed around the first component R or around the second component C or between the first and second components R and C.

Figure 6:
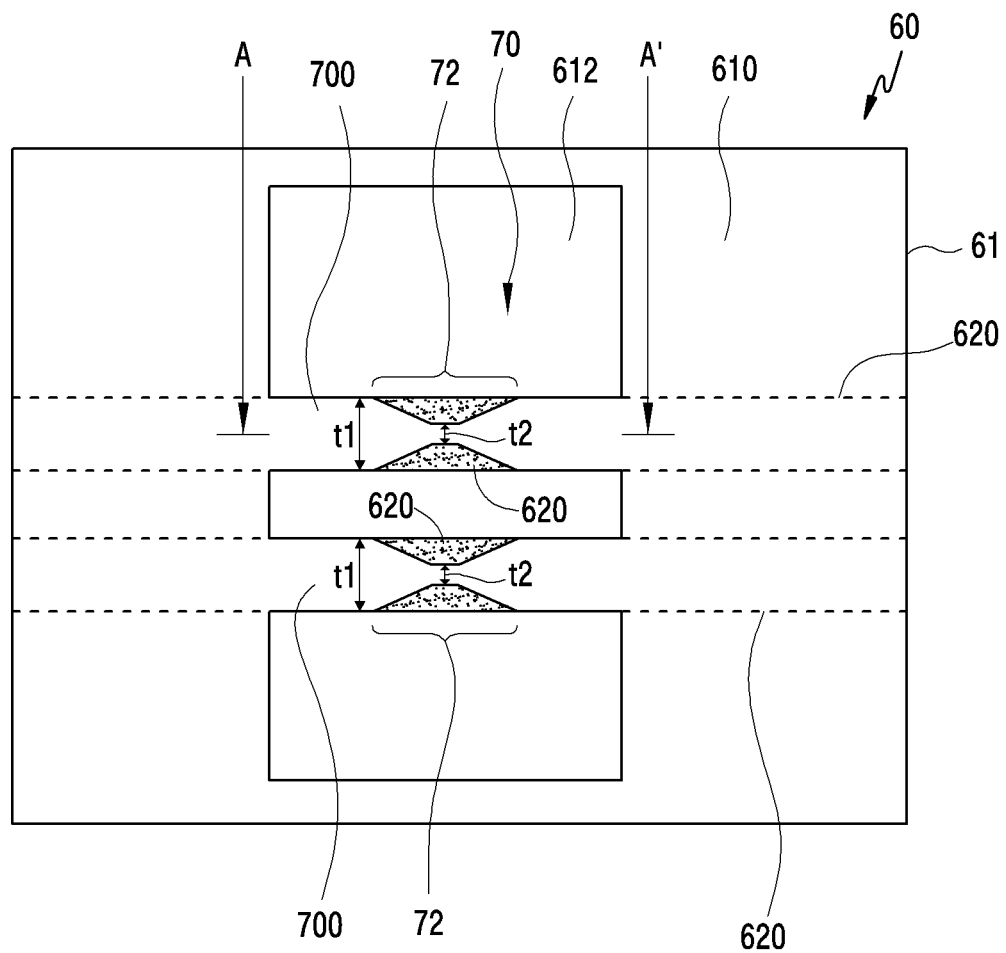
FIG. 6 is a plan view illustrating a structure of a printed circuit board according to various embodiments of the disclosure.
Figure 7:
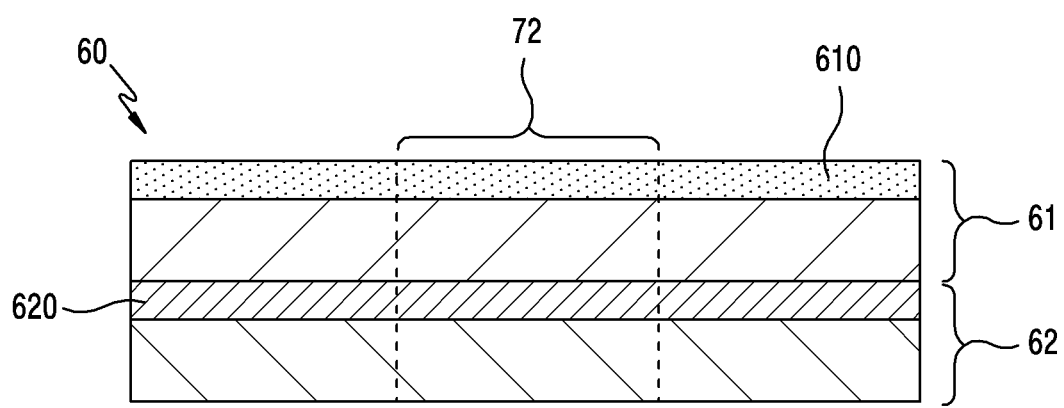
FIG. 7 is a cross-sectional view taken along the line A-A' of FIG. 6.
Figure 8:
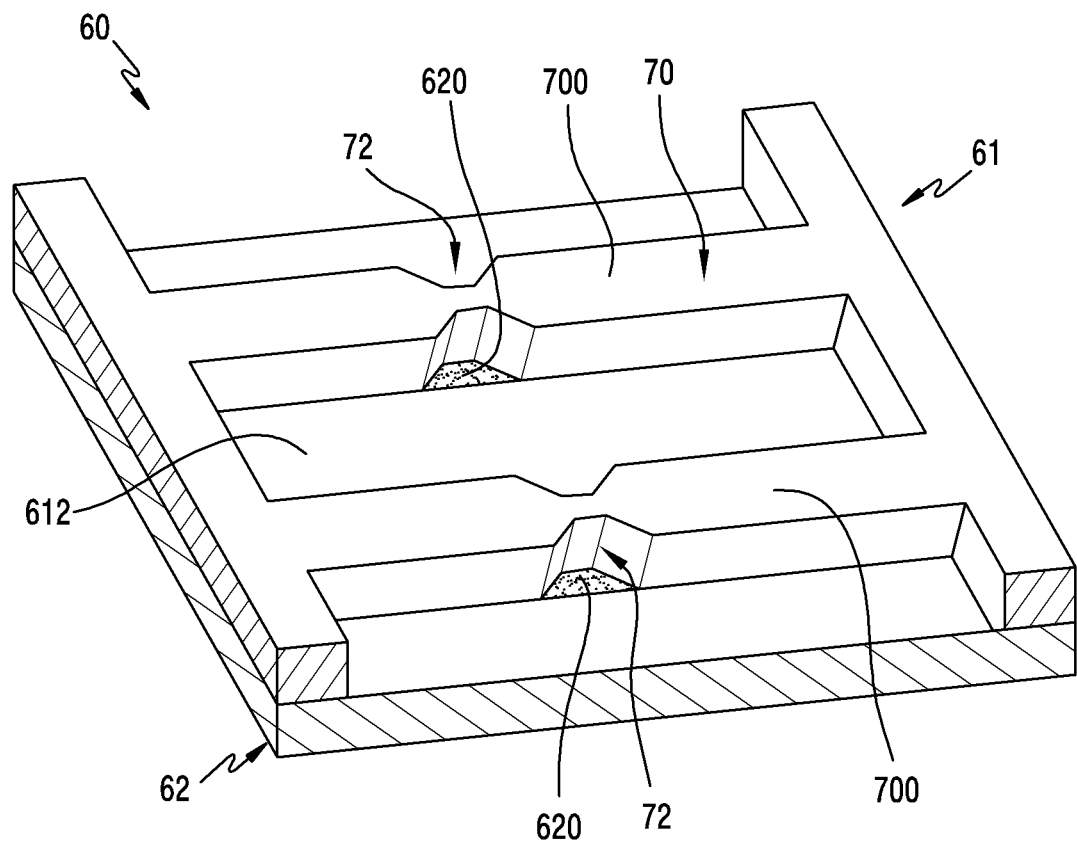
FIG. 8 is a partial exploded perspective view illustrating a structure of a printed circuit board according to various embodiments of the disclosure.

FIG. 6 is a plan view illustrating a structure of a printed circuit board according to various embodiments of the disclosure. FIG. 7 is a cross-sectional view taken along the line A-A' of FIG. 6. FIG. 8 is a partial exploded perspective view illustrating a structure of a printed circuit board according to various embodiments of the disclosure.

Referring to FIG. 6 to FIG. 8, a structure of a printed circuit board 60 according to an embodiment will be described.

The printed circuit board 60 according to an embodiment may include a layered structure of a plurality of boards. Among the plurality of boards, a first circuit board 61 on which at least one slit 612 and a ground bridge structure 70 are disposed and a second circuit board 62 on which at least one high-speed signal line 620 is disposed may be included.

According to an embodiment, the printed circuit board 60 constructed with the layered structure of the plurality of boards may have a slit 612 constructed to block a low-frequency band noise. When the high-speed signal lines 620 pass over or under the slit 612, the ground bridge structure 70 may be present for a return current path of a high-speed signal.

In order to block a noise of a low-frequency band (including DC), there is a need to decrease a current of the low-frequency band. A current flowing through the high-speed signal line may be decreased by attaching a direct resistance, whereas a current caused by a loop constructed by a power source and a ground may induce an effect of a resistance increase by creating the slit 612 such that a current path of the low-frequency band is to be longer than the existing case. Accordingly, the current may decrease, which may result in a decrease in H-field. However, if the circuit board with the slit does not have the return current path for the high-speed signal, high-speed signal wiring may not be possible. This may be considered when the first circuit board 61 according to an embodiment constructs the ground bridge structure 70 with a minimum line width between both ends of the slit 612.

According to an embodiment, in case of the high-speed signal line 620 constructed on the second circuit board 62, a required return current path forms a Gaussian distribution. Therefore, in most cases, the ground bridge structure 70 may be located directly over or under the high-speed signal line 620.

According to an embodiment, the slit 612 constructed on the first circuit board 61 may be constructed around a noise-sensitive component or a noise producing component. For example, the noise-sensitive component may include a receiver or a speaker, and the noise producing component may include a wireless communication module. The slit 612 according to an embodiment may be constructed around an acoustic component or an optical component spaced apart from the acoustic component or within a close distance.

According to an embodiment, the slit 612 may be constructed with a shortest distance between a first region (e.g., the first region a1 of FIG. 4A) to which an acoustic component (e.g., the acoustic component R of FIG. 5) is disposed and a second region (e.g., the second region a2 of FIG. 4A) to which an optical component (e.g., the optical component C of FIG. 5) is disposed. According to an embodiment, the slit 612 may be constructed with a minimum line width (constructed to be greater than or equal to a line width of a signal line).

According to an embodiment, the first circuit board 61 may include the ground bridge structure 70. The ground bridge structure 70 may include one or more ground bridges 700. The ground bridges 700 are parallel to each other, and may traverse between both sides of the slit 612 to split the slit 612 into two or more slits. According to an embodiment, each of the ground bridges 700 may have a conductive structure, as an electrical connection path.

According to an embodiment, the ground bridge structure 70 may include a variable-width structure 72. According to an embodiment, the ground bridge 700 may include the variable-width structure 72. The variable-width structure 72 may have a narrower width t2 at a middle portion than a width t1 at both ends. In order to maximize a noise blocking effect at a low-frequency band, a resistance value at DC shall be set to be great. It is enough that the resistance value is significantly great only in a very short section to bring an effect of decreasing the total current. Therefore, the resistance at DC may be increased by decreasing a line width at some short sections of each of the ground bridges 700.

According to an embodiment, the second circuit board 62 may include one or more high-speed signal lines 620. The one or more high-speed signal lines 620 may be printed on one face of the second circuit board 62. According to an embodiment, when viewed from above the first circuit board 61, each of the high-speed signal lines 620 may be disposed to overlap with the ground bridge 700. The ground bridges 700 may provide a return current path of the respective high-speed signal lines 620. For example, the ground bridges 700 may have a width equal to that of the respective high-speed signal lines 620 or may be slightly greater than that.

Figure 9A:
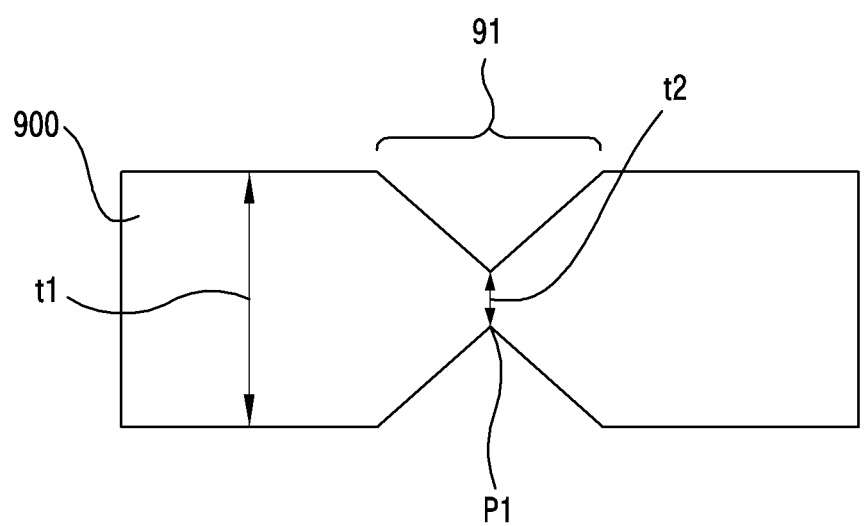
FIG. 9A to FIG. 9C are a drawing illustrating various examples of a variable-width structure constructed on a ground bridge structure according to various embodiments of the disclosure.
Figure 9B:
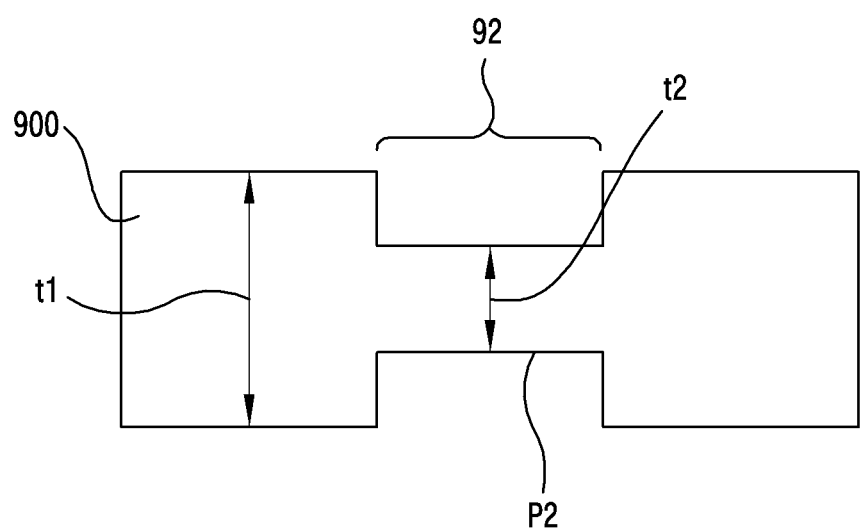
Figure 9C:
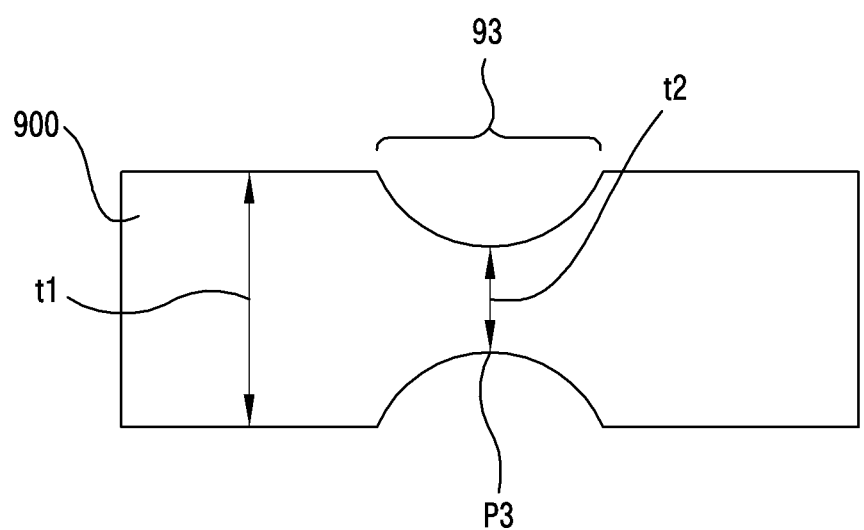

FIG. 9A to FIG. 9C are drawings illustrating various examples of a variable-width structure constructed on the structure 50 of the ground bridge 700.

Referring to FIG. 9A, according to an embodiment, a variable-width structure 91 may be constructed such that a width t2 at a middle portion P1 is narrower than a width t1 at both sides. The width t1 at the both sides may become gradually narrower towards the middle portion P1.

Referring to FIG. 9B, according to an embodiment, a variable-width structure 92 may be constructed such that a width t2 at a middle portion P2 is narrower than a width t1 at both sides. A stepped shape may be exhibited between the width t1 at both sides and the width t2 at the middle portion.

Referring to FIG. 9C, according to an embodiment, a variable-width structure 93 may be constructed such that a width t2 at a middle portion P3 is narrower than a width t1 at both sides. The width t2 at both sides may become gradually narrower towards the middle portion P3.

Figure 10:
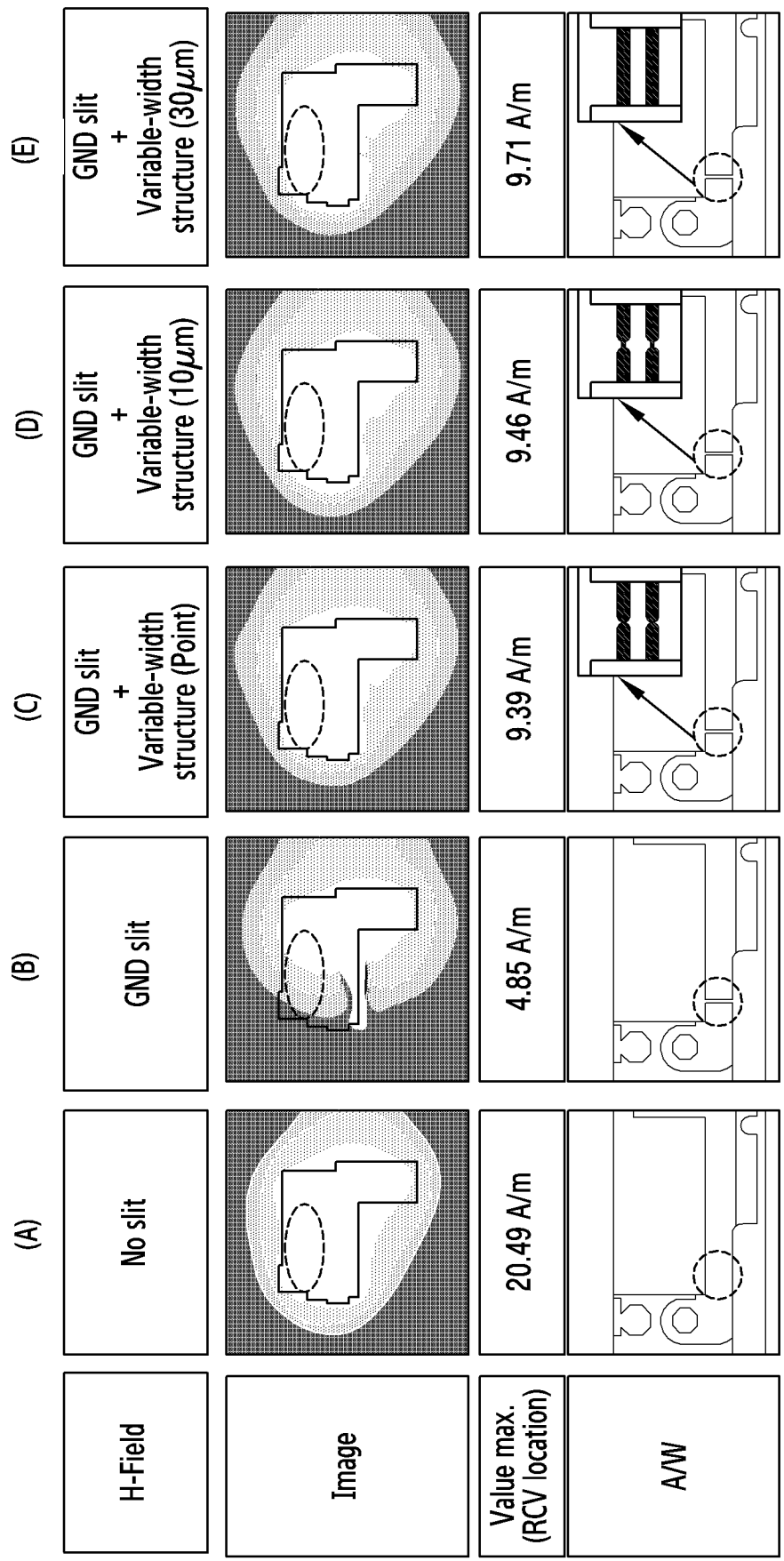
FIG. 10 is a diagram illustrating an example of measurement values depending on whether a slit is present, whether a ground bridge structure is present, and whether a variable-width structure is present, in a printed circuit board according to various embodiments of the disclosure.

FIG. 10 is a diagram illustrating an example of measurement values depending on whether a slit is present, whether a ground bridge structure is present, and whether a variable-width structure is present, in a printed circuit board according to various embodiments of the disclosure. According to an embodiment, in a case where a slit (e.g., the slit 412 of FIG. 4A) is present, a low-frequency band noise may be decreased in a printed circuit board (e.g., the printed circuit board 41 of FIG. 4A) due to a bridge structure (e.g., the bridge structure 50 of FIG. 4B) constructed in the slit and a variable-width structure (e.g., the variable-width structure 72 of FIG. 6) constructed in the ground bridge structure.

Referring to FIG. 10, a measured value is as follows in a case (a) where a slit (e.g., the slit 412 of FIG. 4A) is not present in a printed circuit board (e.g., the printed circuit board 41 of FIG. 4A), a case (b) where a slit (e.g., the slit 412 of FIG. 4A) is present in the printed circuit board, a case (c) where a slit, a ground bridge structure (e.g., the ground bridge structure 50 of FIG. 4B), and a variable-width structure (e.g., the variable-width structure 72 of FIG. 6) are constructed with a point in the printed circuit board, a case (d) where a slit, a ground bridge structure (with a width of 10 μm), and a variable-width structure are constructed in the printed circuit board, and a case (e) where a slit and a ground bridge structure (with a width of 30 μm) are not constructed in the printed circuit board.

It can be seen that, in the printed circuit board according to an embodiment, a low-frequency noise is reduced approximately by ¼ (20.49 A/m→4.85 A/m) in the case (b) where the slit (e.g., the slit 412 of FIG. 4A) is constructed, compared to the case (a) where the slit (e.g., the slit 412 of FIG. 4A) is not present.

In addition, it can be seen that, in the printed circuit board according to an embodiment, a low-frequency noise is reduced approximately by ½ in the cases (c) and (d) (20.49 A/m→9.39 A/m, 9.46 A/m) where the slit (e.g., the slit 412 of FIG. 4A), the ground bridge structure (e.g., the ground bridge structure 50 of FIG. 4B), and the variable-width structure (e.g., the variable-width structure 72 of FIG. 6) are present, compared to the case (a) (20.49 A/m) where the slit is not present.

Figure 11:
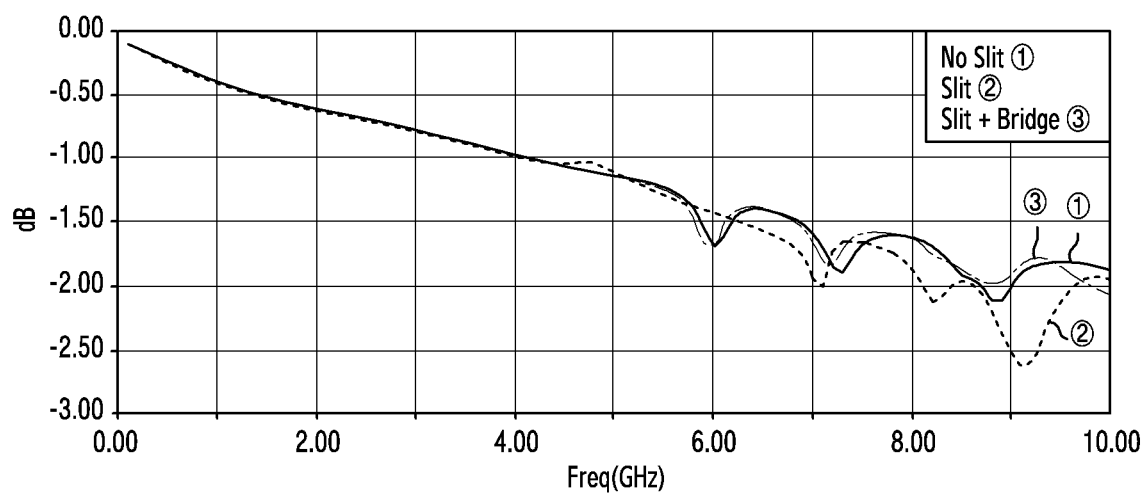
FIG. 11 is a graph illustrating measurement values depending on whether a slit is present and whether a ground bridge structure is present in a printed circuit board according to various embodiments of the disclosure.

FIG. 11 is a graph illustrating measurement values depending on whether a slit is present and whether a ground bridge structure is present in a printed circuit board according to various embodiments of the disclosure.

Referring to FIG. 11, in a printed circuit board (e.g., the printed circuit board 41 of FIG. 4A) according to an embodiment, a low-frequency band noise may be reduced in a case ② where a slit (e.g., the slit 412 of FIG. 4A) is present, compared to a case ① where the slit (e.g., the slit 412 of FIG. 4A) is not present. In a case ③ where a slit and a ground bridge structure (e.g., the ground bridge structure 50 of FIG. 4B) are provided in the printed circuit board according to an embodiment, a return current path of a high-speed signal is ensured, thereby ensuring high-speed signal quality.

According to an embodiment, an electronic device (e.g., the electronic device 100 of FIG. 1 or the electronic device 300 of FIG. 3) may include a printed circuit board (e.g., the printed circuit board 340 of FIG. 3) constructed with a layered structure of a plurality of boards, and may include, among the plurality of boards, a circuit board (e.g., the circuit board 41 of FIG. 4 or the circuit board 51 of FIG. 5) constructed around a first region (e.g., the first region a1 of FIG. 4A) to which an acoustic component (e.g., the acoustic component R of FIG. 5) is disposed, and having at least one slit (e.g., the slit 412 of FIG. 4 or the slit 512 of FIG. 5) constructed to block a low-frequency band noise.

According to an embodiment, the circuit board (e.g., the circuit board 41 of FIG. 4 or the circuit board 51 of FIG. 5) may include a second region (e.g., the second region a2 of FIG. 4B) to which an optical component (e.g., the optical component C of FIG. 5) spaced apart from the acoustic component (e.g., the acoustic component R of FIG. 5) is disposed. The slit may be constructed to traverse between the first and second regions.

According to an embodiment, the acoustic component (e.g., the acoustic component R of FIG. 5) may be a receiver. The optical component (e.g., the optical component C of FIG. 5) may include a camera module.

According to an embodiment, the slit (e.g., the slit 412 of FIG. 4 or the slit 512 of FIG. 5) may be constructed with a shortest distance between the first and second regions (e.g., the first and second regions a1 and a2 of FIG. 4A).

According to an embodiment, the slit (e.g., the slit 412 of FIG. 4 or the slit 512 of FIG. 5) may be constructed in a linear shape.

According to an embodiment, an electronic device (e.g., the electronic device 100 of FIG. 1 or the electronic device 300 of FIG. 3) may include a printed circuit board constructed with a layered structure of a plurality of boards, and may include, among the plurality of layered boards, a first circuit board (e.g., the circuit board 41 of FIG. 4 or the circuit board 51 of FIG. 5 or the circuit board 61 of FIG. 6) including a ground plane (e.g., the ground plane 610 of FIG. 6) constructed on at least one face, a slit (e.g., the slit 412 of FIG. 4 or the slit 512 of FIG. 5) constructed in at least some regions of the ground plane, and at least one ground bridge structure (e.g., the ground bridge structure 50 of FIG. 4B or the ground bridge structure 70 of FIG. 6) traversing the slit, and a second circuit board (e.g., the second circuit board 62 of FIG. 6) including at least one high-speed signal line (e.g., the high-speed signal line 620 of FIG. 6) disposed such that at least one portion overlaps over or under the ground bridge structure.

According to an embodiment, when viewed from above the first circuit board (e.g., the circuit board 41 of FIG. 4 or the circuit board 51 of FIG. 5 or the circuit board 61 of FIG. 6), the ground bridge structure (e.g., the ground bridge structure 50 of FIG. 4B or the ground bridge structure 70 of FIG. 6) and the signal line (e.g., the high-speed signal line 620 of FIG. 6) are disposed in an overlapping manner.

According to an embodiment, a width of the ground bridge structure (e.g., the ground bridge structure 50 of FIG. 4B) may be identical to a width of the signal line (e.g., the ground bridge structure 70 of FIG. 6).

According to an embodiment, the slit (e.g., the slit 412 of FIG. 4 or the slit 512 of FIG. 5) may be constructed around an acoustic component disposed on the first circuit board (e.g., the circuit board 41 of FIG. 4 or the circuit board 51 of FIG. 5 or the circuit board 61 of FIG. 6).

According to an embodiment, the ground bridge structure (e.g., the ground bridge structure 50 of FIG. 4B or the ground bridge structure 70 of FIG. 6) may include a variable-width structure (e.g., the variable-width structure 72 of FIG. 6).

According to an embodiment, the variable-width structure (e.g., the variable-width structure 72 of FIG. 6) may be constructed such that a width at a middle portion is narrower than a width at both ends.

According to an embodiment, the slit (e.g., the slit 412 of FIG. 4 or the slit 512 of FIG. 5) may be constructed around a noise producing source.

According to an embodiment, the noise producing source may include a communication module.

According to an embodiment, an electronic device (e.g., the electronic device 100 of FIG. 1 or the electronic device 300 of FIG. 3) may include a printed circuit board constructed with a layered structure of a plurality of boards, and may include, among the plurality of layered boards, a first circuit board (e.g., the circuit board 41 of FIG. 4 or the circuit board 51 of FIG. 5 or the circuit board 61 of FIG. 6) including a ground plane constructed on at least one face and a slit (e.g., the slit 412 of FIG. 4 or the slit 512 of FIG. 5) constructed in at least some regions of the ground plane, and a second circuit board (e.g., the second circuit board 62 of FIG. 6) disposed over or under the first circuit board and including at least one high-speed signal line (e.g., the high-speed signal line 620 of FIG. 6). The first circuit board may include at least one ground bridge structure (e.g., the ground bridge structure 50 of FIG. 4B or the ground bridge structure 70 of FIG. 6) traversing the slit to provide a return current path of each of the high-speed signal lines.

According to an embodiment, each of the ground bridge structures (e.g., the ground bridge structure 50 of FIG. 4B or the ground bridge structure 70 of FIG. 6) may include a variable-width structure (e.g., the variable-width structure 72 of FIG. 6). The variable-width structure (e.g., the variable-width structure 72 of FIG. 6) may be constructed such that a width at a middle portion is narrower than a width at both ends.

Various embodiments of the disclosure disclosed in the present specification and the drawing are merely a specific example presented for clarity and are not intended to limit the scope of the embodiments of the present disclosure. Therefore, in addition to the embodiments disclosed herein, various changes in forms and details made without departing from the technical concept of the various embodiments of the disclosure will be construed as being included in the scope of the various embodiments of the present disclosure.

The invention claimed is:

1. An electronic device comprising:
a printed circuit board constructed with a layered structure of a plurality of boards;
among the plurality of boards, a first circuit board constructed around a first region to which an acoustic component is disposed, and having at least one slit constructed to block a low-frequency band noise; and
a second circuit board including at least one high-speed signal line disposed such that at least one portion overlaps over or under a ground bridge structure,
wherein the first circuit board including a ground plane constructed on at least one face, a slit constructed in at least some regions of the ground plane, and the ground bridge structure traversing the slit,
wherein the ground bridge structure includes a variable-width structure, and
wherein the variable-width structure is constructed such that a width at a middle portion is narrower than a width at both ends.

2. The electronic device of claim 1,
wherein the first circuit board comprises a second region to which an optical component spaced apart from the acoustic component is disposed, and
wherein the slit is constructed to traverse between the first and second regions.

3. The electronic device of claim 2, wherein the acoustic component is a receiver, and the optical component includes a camera module.

4. The electronic device of claim 2, wherein the slit is constructed with a shortest distance between the first and second regions.

5. The electronic device of claim 2, wherein the slit is constructed in a linear shape.

6. The electronic device of claim 1, wherein, when viewed from above the first circuit board, the ground bridge structure and the signal line are disposed in an overlapping manner.

7. The electronic device of claim 6, wherein a width of the ground bridge structure is identical to a width of the signal line.

8. The electronic device of claim 1, wherein the slit is constructed around an acoustic component disposed on the first circuit board.

9. The electronic device of claim 1, wherein the ground bridge structure includes a variable-width structure.

10. The electronic device of claim 9, wherein the variable-width structure is constructed such that a width at a middle portion is narrower than a width at both ends.

11. The electronic device of claim 1, wherein the slit is constructed around a noise producing source.

12. The electronic device of claim 11, wherein the noise producing source includes a communication module.

13. An electronic device comprising:
a printed circuit board constructed with a layered structure of a plurality of boards;
among the plurality of layered boards, a first circuit board including a ground plane constructed on at least one face and a slit constructed in at least some regions of the ground plane; and
a second circuit board disposed over or under the first circuit board and including at least one high-speed signal line,
wherein the first circuit board includes at least one ground bridge structure traversing the slit to provide a return current path of each of the high-speed signal,
wherein each of the ground bridge structures includes a variable-width structure, and
wherein the variable-width structure is constructed such that a width at a middle portion is narrower than a width at both ends.

* * * * *